United States Patent
Hsin

(10) Patent No.: US 7,440,263 B2
(45) Date of Patent: *Oct. 21, 2008

(54) IMAGE SENSOR AND METHOD FOR MANUFACTURING THE SAME

(75) Inventor: Chung Hsien Hsin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 396 days.

This patent is subject to a terminal disclaimer.

(21) Appl. No.: 10/621,963

(22) Filed: Jul. 16, 2003

(65) Prior Publication Data
US 2005/0013098 A1    Jan. 20, 2005

(51) Int. Cl.
*H05K 7/20* (2006.01)

(52) U.S. Cl. .................. 361/679; 257/696; 438/126

(58) Field of Classification Search ......... 361/679–687, 361/724–727, 695; 257/666, 668, 678, 680, 257/692–696; 384/294, 307; 438/64, 126
See application file for complete search history.

(56) References Cited

U.S. PATENT DOCUMENTS

| | | | |
|---|---|---|---|
| 2004/0113049 A1* | 6/2004 | Hsieh et al. | 250/208.1 |
| 2004/0140420 A1* | 7/2004 | Dai et al. | 250/214 R |

* cited by examiner

*Primary Examiner*—Hung V Duong
(74) *Attorney, Agent, or Firm*—Pro-Techtor Int'l Services

(57) ABSTRACT

An image sensor and a method for manufacturing the same. The image sensor includes a substrate, a photosensitive chip mounted to the substrate, a plurality of wires for electrically connecting the photosensitive chip to the substrate, a frame layer mounted to the substrate to surround the photosensitive chip. And a transparent layer is fixed and encapsulated by the frame layer such that the photosensitive chip may receive optical signals passing through the transparent layer.

6 Claims, 2 Drawing Sheets

IMAGE SENSOR AND METHOD FOR MANUFACTURING THE SAME

BACKGROUND OF THE INVENTION

1. Field of the Invention

The present invention relates to an image sensor and a method for manufacturing the same, and more particularly to an image sensor in which may be conveniently manufactured with reduced manufacturing costs.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor includes a substrate 10, a frame layer 12, a photosensitive chip 14, a plurality of wires 15, and a transparent layer 22. The substrate 10 has an upper surface 12 formed with signal input terminals 15, and a lower surface 13 formed with signal output terminals 16. The frame layer 12 has an upper surface 20 and a lower surface 22, which is arranged on the substrate 10 to form a cavity 24 together with the substrate 10. The photosensitive chip 26 is arranged within the cavity 24 formed by the substrate 10 and the frame layer 12. The wires 28 has a first end 30 electrically connected to the photosensitive chip 26, and second end 32 electrically connected to the signal input terminals 15 of the substrate 10. The transparent layer 34 is adhered to the frame layer 18 in order to cover the photosensitive chip 26.

However, the above-mentioned image sensor has the following drawbacks.

1. When the image sensor is packaged, the frame layer 18 has to be mounted to the substrate 10, and then the chip mounting and wire bonding processes may be performed. When the wires 28 are bonded between the photosensitive chip 24 and the frame layer 18, the short distance will cause inconvenience in manufacturing.

2. During the manufacturing or transporting process of the transparent layer 34, particles are often attached to the periphery of the transparent layer 34. The particles may tend to fall into the image sensor and thus influence the image sensor quality. Consequently, the transparent layer 34 has to be chamfered to protect its periphery from particles or damage, thereby increasing the manufacturing cost and inconvenience in manufacturing.

SUMMARY OF THE INVENTION

An object of the present invention is to provide an image sensor and a method for manufacturing the same, which may simplify the manufacturing processes and reduce the manufacturing cost.

Another object of the present invention is to provide an image sensor capable of protecting the transparent layer from contamination and damage and facilitating the manufacturing processes accordingly.

To achieve the above-mentioned objects, the present invention provides an image sensor and a method for manufacturing the same. The image sensor includes a substrate, a photosensitive chip mounted to the substrate, a plurality of wires for electrically connecting the photosensitive chip to the substrate. And a frame layer mounted to the substrate to surround the photosensitive chip, a transparent layer is fixed and encapsulated by the frame layer such that the photosensitive chip may receive optical signals passing through the transparent layer. Utilizing the frame layer to clamp and fix the transparent layer and then mounting the frame layer to the substrate may easily achieve the objects and functions of the invention.

DETAILED DESCRIPTION OF THE PRESENT INVENTION

Figure 1:
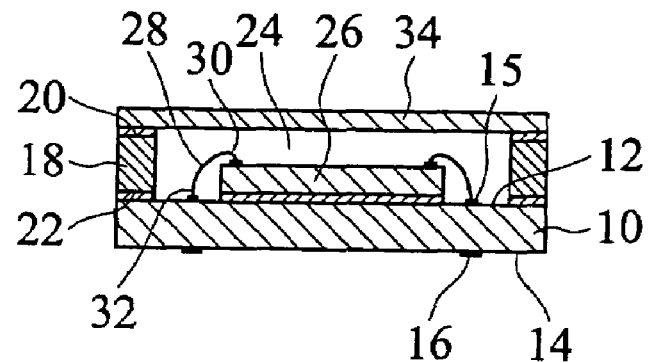
FIG. 1 is a schematic illustration showing a conventional image sensor.
Figure 2:
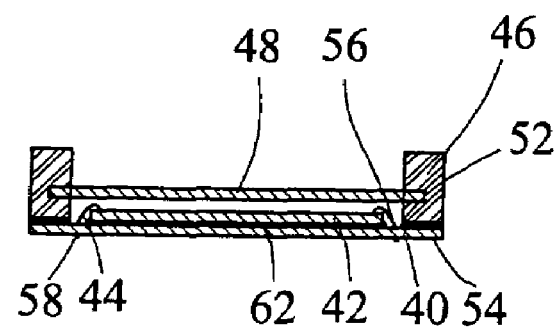
FIG. 2 is a cross-sectional view showing an image sensor of the present invention.

Referring to FIG. 2, an image sensor of the present invention includes a substrate 40, a photosensitive chip 42, a plurality of wires 44, a frame layer 46, and a transparent layer 48.

The substrate 40 has an upper surface 52 formed with a plurality of first connection points 56, and a lower surface 54 formed with a plurality of second connection points 58.

The photosensitive chip 42 is adhered to the upper surface 52 of the substrate 40 by an adhesive 62.

The wires 44 electrically connect the photosensitive chip 42 to the first connection points 56 on the upper surface 52 of the substrate 40 in order to transfer signals from the photosensitive chip 42 to the substrate 40.

The frame layer 46 is mounted to the upper surface 52 of the substrate 40 to surround the photosensitive chip 42. A transparent layer 48 is fixed and encapsulated by the frame layer 46 so that the photosensitive chip 42 may receive optical signals passing through the transparent layer 48.

In this embodiment, the frame layer 46 is formed of industrial plastic material by way of injection molding, and the transparent layer 48 is simultaneously fixed, wherein the transparent layer 48 is a piece of transparent glass.

Figure 3:
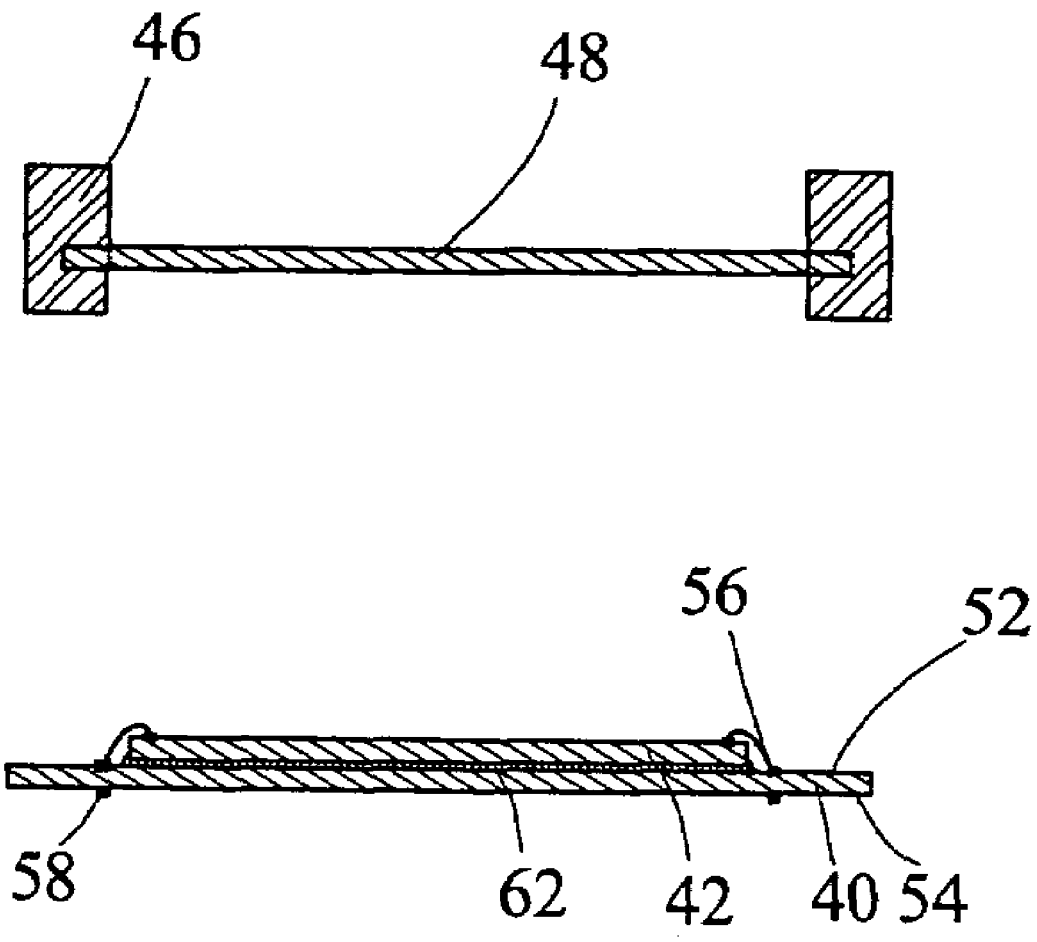
FIG. 3 is an exposed view showing the image sensor of the present invention.

Referring to FIGS. 3 in conjunction with FIG. 2, a method for manufacturing an image sensor of the present invention includes the steps of:

Providing a substrate 40 having an upper surface 52 formed with a plurality of first connection points 56, and a lower surface 54 formed with a plurality of second connection points 58.

Mounting a photosensitive chip 42 to the upper surface 52 of the substrate 40.

Providing a plurality of wires 44 to electrically connect the photosensitive chip 42 to the first connection points 56 on the upper surface 52 of the substrate 40.

Mounting a frame layer 46 on the upper surface 52 of the substrate 40 to surround the photosensitive chip 42. And a transparent layer 48 is fixed and encapsulated by the frame layer 46 such that the photosensitive chip 42 may receive optical signals passing through the transparent layer 48. The frame layer 46 in this embodiment is formed of industrial plastic material by way of injection molding to simultaneously fix the transparent layer 48, which is a piece of transparent glass.

The invention has the following advantages.

1. Since the periphery of the transparent layer 48 is inserted into the frame layer 46, the periphery does not have to be chamfered. Thus, the manufacturing processes may be simplified, and the manufacturing cost may be reduced.

2. Since the periphery of the transparent layer 48 is free from being damaged, broken, or contaminated, the product quality may be effectively enhanced.

3. Since the frame layer 46 is mounted to the substrate 40 after the wires are bonded from the photosensitive chip 42 to the substrate 40, the wire bonding process may be simplified.

While the present invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. An image sensor to be mounted to a printed circuit board, the image sensor comprising:
    a substrate having an upper surface formed with a plurality of first connection points, and a lower surface formed with a plurality of second connection points, which is electrically connect to the printed circuit board;
    a photosensitive chip mounted to the upper surface of the substrate;
    a plurality of wires for electrically connecting the photosensitive chip to the first connection points on the upper surface of the substrate; and
    a frame layer mounted to the upper surface of the substrate to surround the photosensitive chip, and a transparent layer being fixed and encapsulated by the frame layer such that the photosensitive chip may receive optical signals passing through the transparent layer.

2. The image sensor according to claim 1, wherein the frame layer is made of industrial plastic material by way of injection molding to encapsulate the transparent layer.

3. The image sensor according to claim 1, wherein the transparent layer is a piece of transparent glass.

4. A method for manufacturing an image sensor, comprising the steps of:
    providing a substrate having an upper surface formed with a plurality of first connection points, and a lower surface formed with a plurality of second connection points, which is electrically connect to the printed circuit board;
    mounting a photosensitive chip to the upper surface of the substrate;
    providing a plurality of wires for electrically connecting the photosensitive chip to the first connection points on the upper surface of the substrate; and
    mounting a frame layer to the upper surface of the substrate so as to surround the photosensitive chip, and a transparent layer is fixed and encapsulated by the frame layer such that the photosensitive chip may receive optical signals passing through the transparent layer.

5. The method according to claim 4, wherein the frame layer is made of industrial plastic material by way of injection molding to encapsulate the transparent layer.

6. The method according to claim 4, wherein the transparent layer is a piece of transparent glass.

* * * * *